(12) United States Patent
Kyushima et al.

(10) Patent No.: US 9,225,924 B2
(45) Date of Patent: Dec. 29, 2015

(54) SOLID-STATE IMAGING DEVICE INCLUDING SIGNAL CONNECTING SECTION AND SOLID-STATE IMAGING DEVICE DRIVING METHOD

(75) Inventors: Ryuji Kyushima, Hamamatsu (JP); Kazuki Fujita, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 243 days.

(21) Appl. No.: 13/979,052

(22) PCT Filed: Dec. 7, 2011

(86) PCT No.: PCT/JP2011/078321
§ 371 (c)(1),
(2), (4) Date: Jul. 10, 2013

(87) PCT Pub. No.: WO2012/096080
PCT Pub. Date: Jul. 19, 2012

(65) Prior Publication Data
US 2013/0299679 A1 Nov. 14, 2013

(30) Foreign Application Priority Data
Jan. 12, 2011 (JP) ................. 2011-004284

(51) Int. Cl.
| | |
|---|---|
| *H01L 27/00* | (2006.01) |
| *H04N 5/378* | (2011.01) |
| *H01L 27/146* | (2006.01) |
| *H04N 5/32* | (2006.01) |
| *H04N 5/359* | (2011.01) |
| *H04N 5/374* | (2011.01) |

(52) U.S. Cl.
CPC .......... *H04N 5/378* (2013.01); *H01L 27/14632* (2013.01); *H01L 27/14687* (2013.01); *H04N 5/32* (2013.01); *H04N 5/3597* (2013.01); *H04N 5/374* (2013.01); *H01L 27/14643* (2013.01)

(58) Field of Classification Search
CPC ....... H04N 5/32; H04N 5/378; H04N 5/3597; H04N 5/343; H04N 5/347; H04N 5/353; H01L 27/14658
USPC ................... 250/208.1, 214 R; 348/294–311; 378/62, 98.8, 98.9, 114–116; 257/290–292, 440
See application file for complete search history.

(56) References Cited

U.S. PATENT DOCUMENTS

| | | | |
|---|---|---|---|
| 7,525,585 B2 * | 4/2009 | Murakami et al. ............ 348/294 |
| 2005/0040352 A1 | 2/2005 | Maolinbay et al. | |
| 2009/0268867 A1 | 10/2009 | Mori et al. | |

FOREIGN PATENT DOCUMENTS

| | | |
|---|---|---|
| CN | 1820498 | 8/2006 |
| JP | 11-150255 A | 6/1999 |

(Continued)

*Primary Examiner* — Que T Le
(74) *Attorney, Agent, or Firm* — Drinker Biddle & Reath LLP

(57) ABSTRACT

A controlling section causes a charge of a photodiode to be output to an integration circuit by bringing a readout switch into a connected state, and then brings the readout switch into a non-connected state. Thereafter, a voltage value is output to a holding circuit from the integration circuit. After carrying out the output operation mentioned above, an operation for causing a charge held in an integrating capacitive element to be discharged, and bringing the readout switch into a connected state to cause a charge held in the photodiode to be discharged and an operation for causing voltage values held in the holding circuits to be sequentially output are carried out in parallel. Accordingly, a solid-state imaging device and a method of driving it capable of solving the problems due to a memory effect, a delay effect, and switching noise are realized.

6 Claims, 6 Drawing Sheets

(56) References Cited

FOREIGN PATENT DOCUMENTS

| JP | 2000-165754 | | 6/2000 |
| JP | 2001-345440 | A | 12/2001 |
| JP | 2004-080410 | A | 3/2004 |
| JP | 2005-110220 | A | 4/2005 |
| JP | 2007-221453 | | 8/2007 |
| JP | 2008-228346 | A | 9/2008 |
| WO | WO 2009/131153 | | 10/2009 |

* cited by examiner

SOLID-STATE IMAGING
SOLID-STATE IMAGING DEVICE INCLUDING SIGNAL CONNECTING SECTION AND SOLID-STATE IMAGING DEVICE DRIVING METHOD

TECHNICAL FIELD

The present invention relates to a solid-state imaging device and a method of driving a solid-state imaging device.

BACKGROUND ART

Patent Document 1 describes a method for reducing a delay by shortening the readout time in a flat panel X-ray detector formed of amorphous silicon.

CITATION LIST

Patent Literature

Patent Document 1: Japanese Patent Application Laid-Open No. 2005-110220

SUMMARY OF INVENTION

Technical Problem

A two-dimensional flat-panel image sensor has an arrangement composed of a plurality of pixels including photodiodes and switching elements formed with use of amorphous silicon. In a two-dimensional flat-panel image sensor with this arrangement, if the frame rate is increased, a so-called memory effect remarkably appears, in which a charge is transiently trapped when a switching element, such as, for example, a field effect type transistor (Field Effect Transistor, hereinafter, referred to as an "FET"), that is formed with amorphous silicon is brought into a non-connected state. This is because amorphous silicon that is non-crystalline has a high density of levels to trap a charge in FET channels. Therefore, there is a problem that the stabilization time to release a trapped charge is required (hereinafter, referred to as a "problem due to a memory effect"). Further, there is a problem that charges accumulated in the photodiodes are not entirely transferred within a predetermined transfer time, but are superimposed on a next frame of data (hereinafter, referred to as a "problem due to a delay effect").

When a rolling shutter method for sequential scanning of respective rows is adopted in a passive pixel-type arrangement, a "hold period" in which signals from the photodiodes corresponding to one row are simultaneously transferred to a signal connecting section and a "readout period" in which the held signals corresponding to several columns are read out by scanning are alternately repeated, however, if the "hold period" is shortened to increase the frame rate, a memory effect and delay effect become remarkable, so that an image lag becomes remarkable.

Patent Document 1 discloses a method, in order to solve problems due to a memory effect and delay effect, of causing the resetting period of an integration circuit to overlap with a part of the sampling time where charge of a photodiode is transferred. However, in the case of causing driving in accordance with the timing chart disclosed in Patent Document 1, the following problem occurs. That is, a transient charge is generated when an FET is brought into a connected state, and the transient charge is superimposed on a charge that is transferred from the photodiode, but the sampling time ends with the transient charge remaining superimposed in this timing chart, so that the superimposed transient charge is not cancelled (hereinafter, referred to as a "problem due to switching noise").

It is therefore an object of the present invention to provide a solid-state imaging device and a method of driving a solid-state imaging device capable of solving the problem due to a memory effect, the problem due to a delay effect, and the problem due to switching noise.

Solution to Problem

A solid-state imaging device according to the present invention includes a photodetecting section having M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, a signal connecting section including an integration circuit connected to each of the N readout wiring lines, and for outputting a voltage value according to an amount of charge input through the readout wiring line, a holding circuit connected in series via an input switch with the integration circuit, and for holding a voltage value output from the integration circuit, and an output switch connected to the holding circuit, and for outputting a voltage value held in the holding circuit, and a controlling section for controlling opening and closing operations of the readout switches of the respective pixels and the input switches and controlling opening and closing operations of the output switches to cause voltage values according to amounts of charges generated in the photodiodes of the respective pixels to be sequentially output from the holding circuits, and in which the readout switch is a semiconductor switch containing polycrystalline silicon, the integration circuit includes an amplifier connected in series between the readout wiring line and the holding circuit and an integrating capacitive element connected in parallel with the amplifier, and the controlling section includes a first operation for causing a charge of the photodiode to be output to the integration circuit by bringing the readout switch into a connected state, and then bringing the readout switch into a non-connected state, and thereafter causing a voltage value to be output to the holding circuit from the integration circuit, a second operation for causing a charge held in the integrating capacitive element to be discharged, and bringing the readout switch into a connected state to cause a charge held in the photodiode to be discharged, and a third operation for causing voltage values held in the holding circuits to be sequentially output, and carries out the second operation and the third operation in parallel after carrying out the first operation.

The solid-state imaging device according to the present invention causes a charge of the photodiode to be output to the integration circuit by bringing the readout switch into a connected state, and then brings the readout switch into a non-connected state. Accordingly, a transient charge generated when the readout switch was brought into a connected state can be cancelled by a transient charge having a reverse polarity generated when the readout switch was brought into a non-connected state. Consequently, the problem due to switching noise can be solved.

Moreover, the device causes discharging of a charge held in the integrating capacitive element, and brings the readout switch into a connected state to cause discharging of a charge held in the photodiode. Accordingly, it becomes possible to discharge together with discharging of the integrating capacitive element a charge that remained when outputting a charge of the photodiode to the integration circuit in the photodiode. Consequently, the problem due to a delay effect can be solved.

Moreover, the readout switch is a semiconductor switch containing polycrystalline silicon. Accordingly, the problem due to a memory effect can be solved.

Moreover, a method of driving a solid-state imaging device according to the present invention is a method of driving a solid-state imaging device including a photodetecting section having M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, an integration circuit including an amplifier connected in series to the readout wiring line and an integrating capacitive element connected in parallel with the amplifier, and for outputting a voltage value according to an amount of charge input through the readout wiring line, and a holding circuit for holding a voltage value output from the integration circuit, and includes a first step of causing a charge of the photodiode to be output to the integration circuit by bringing the readout switch into a connected state, and then bringing the readout switch into a non-connected state, and thereafter causing a voltage value to be output to the holding circuit from the integration circuit, a second step of causing a charge held in the integrating capacitive element to be discharged, and bringing the readout switch into a connected state to cause a charge held in the photodiode to be discharged, and a third step of causing voltage values held in the holding circuits to be sequentially output, and in which the readout switch is a semiconductor switch containing polycrystalline silicon, and the second step and the third step are performed in parallel after the first step.

The method of driving a solid-state imaging device according to the present invention causes a charge of the photodiode to be output to the integration circuit by bringing the readout switch into a connected state, and then brings the readout switch into a non-connected state. Accordingly, a transient charge generated when the readout switch was brought into a connected state can be cancelled by a transient charge having a reverse polarity generated when the readout switch was brought into a non-connected state. Consequently, the problem due to switching noise can be solved.

Moreover, the method causes discharging of a charge held in the integrating capacitive element, and brings the readout switch into a connected state to cause discharging of a charge held in the photodiode. Accordingly, it becomes possible to discharge together with discharging of the integrating capacitive element a charge that remained when outputting a charge of the photodiode to the integration circuit in the photodiode. Consequently, the problem due to a delay effect can be solved.

Moreover, the readout switch is a semiconductor switch containing polycrystalline silicon. Accordingly, the problem due to a memory effect can be solved.

Advantageous Effects of Invention

The solid-state imaging device and method of driving a solid-state imaging device by the present invention can solve the problem due to a memory effect, the problem due to a delay effect, and the problem due to switching noise.

DESCRIPTION OF EMBODIMENTS

Hereinafter, embodiments of the present invention will be described in detail with reference to the accompanying drawings. Also, the same components will be denoted with the same reference symbols in the description of the drawings, and overlapping description will be omitted.

Figure 1:
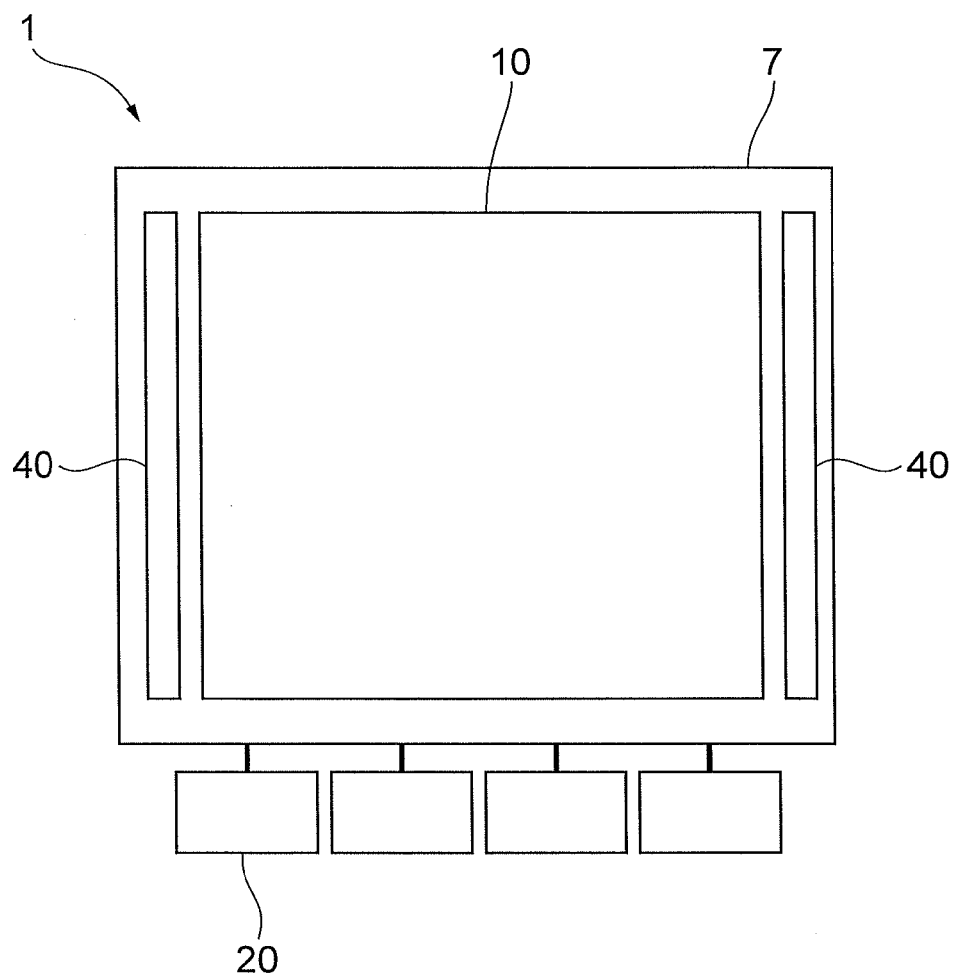
FIG. 1 is a plan view showing a configuration of a solid-state imaging device.
Figure 2:
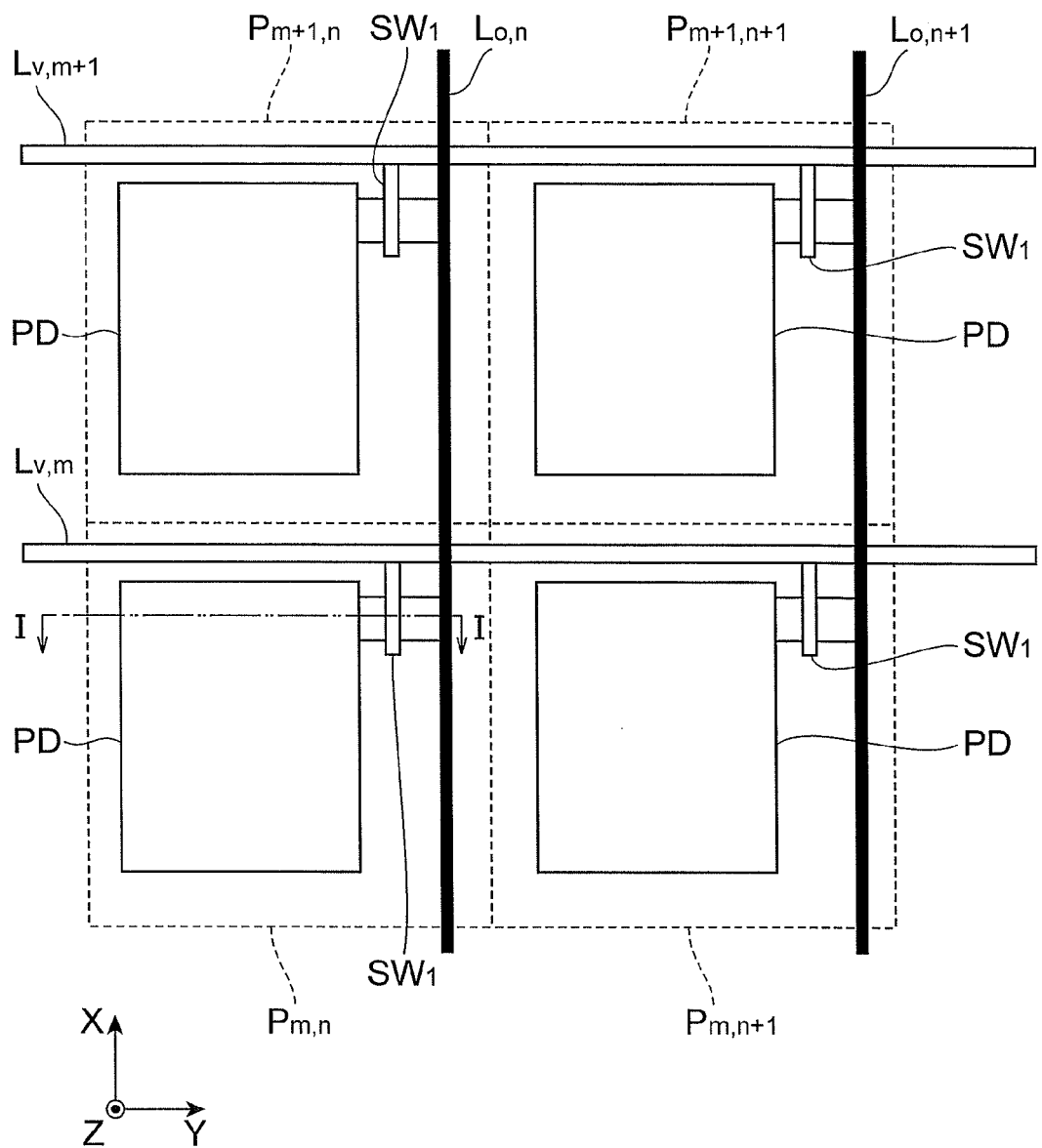
FIG. 2 is a plan view showing a configuration of a pixel part of the solid-state imaging device.
Figure 3:
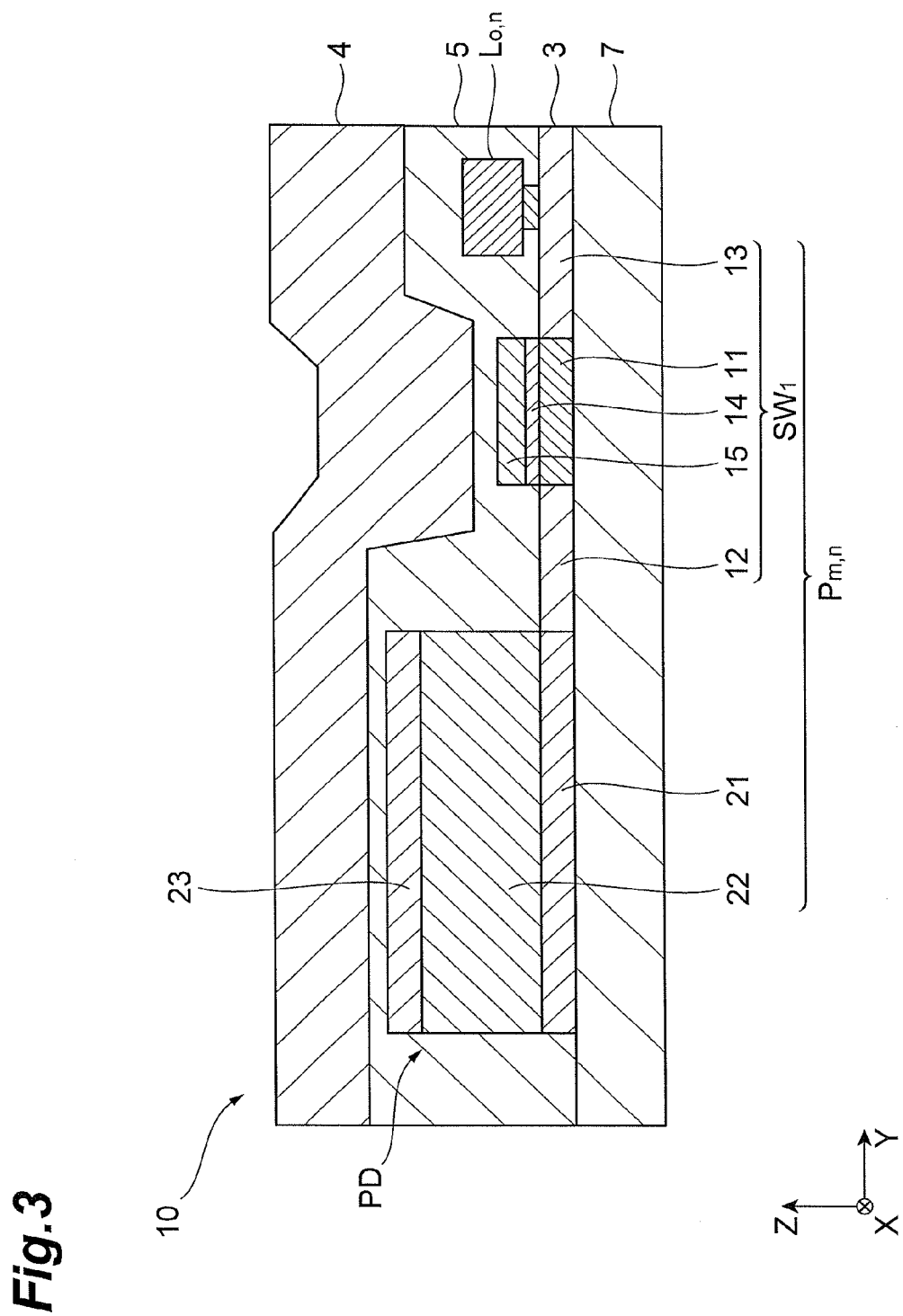
FIG. 3 is a side sectional view showing a section of the solid-state imaging device taken along a line I-I of FIG. 2.

The solid-state imaging device according to the present embodiment is used for, for example, a medical X-ray imaging system, and used particularly for a system for taking X-ray images of the jaw of a subject being tested by imaging modes such as panoramic radiography, cephalography, and CT in dentistry medical treatment. Therefore, the solid-state imaging device of the present embodiment includes thin-film transistors formed by polycrystalline silicon deposited on a large-area glass substrate, and has a remarkably wide photodetecting area as compared with that of a conventional solid-state imaging device prepared from a monocrystalline silicon wafer. FIG. 1 to FIG. 3 are views showing a configuration of the solid-state imaging device 1 of the present embodiment. FIG. 1 is a plan view showing the solid-state imaging device 1, and FIG. 2 is a partially enlarged plan view of the solid-state imaging device 1. Further, FIG. 3 is a side sectional view taken along a line I-I of FIG. 2. Also, in FIG. 1 to FIG. 3, an XYZ orthogonal coordinate system is also shown for easy understanding.

As shown in FIG. 1, the solid-state imaging device 1 includes a photodetecting section 10 built in a principal surface of a glass substrate 7, a signal connecting section 20, and a scanning shift register 40. Also, the photodetecting section 10, the signal connecting section 20, and the scanning shift register 40 may be respectively provided on separate glass substrates 7.

As shown in FIG. 2, the photodetecting section 10 is composed of M×N pixels P two-dimensionally arrayed in M rows and N columns. The pixel $P_{m,n}$ is located on the m-th row and the n-th column. Here, m is an integer not less than 1 and not more than M, and n is an integer not less than 1 and not more than N. Also, in FIG. 2, the column direction is coincident with the X-axis direction, and the row direction is coincident with the Y-axis direction. Each of M and N is an integer not less than 2. The pixel P includes a photodiode PD and a switch $SW_1$ (readout switch). To the switch $SW_1$, an m-th row selection wiring line $L_{V,m}$, is connected. The photodiode PD is connected to an n-th column readout wiring line $L_{O,n}$ via the switch $SW_1$.

Moreover, as shown in FIG. 3, the photodiode PD, the switch $SW_1$, and the n-th column readout wiring line $L_{O,n}$ are formed on the surface of a silicon film 3 formed on the glass substrate 7. Further, on the photodiode PD, the switch $SW_1$, and the n-th column readout wiring line $L_{O,n}$, a scintillator 4 is provided via an insulating layer 5. The photodiode PD is constructed containing, for example, amorphous silicon. The photodiode PD of the present embodiment includes an n-type semiconductor layer 21 made of polycrystalline silicon, an i-type semiconductor layer 22 made of amorphous silicon provided on the n-type semiconductor layer 21, and a p-type semiconductor layer 23 made of amorphous silicon provided on the i-type semiconductor layer 22. The switch $SW_1$ is an FET formed of polycrystalline silicon, and includes a channel region 11, a source region 12 disposed along one side surface of the channel region 11, a drain region 13 disposed along the other side surface of the channel region 11, and a gate insulating film 14 and a gate electrode 15 formed on the channel region 11. The n-th column readout wiring line $L_{O,n}$ is formed of metal. The scintillator 4 generates scintillation light in response to incident X-rays to convert an X-ray image into an optical image, and outputs the optical image to the photodetecting section 10.

The polycrystalline silicon that forms the readout switch $SW_1$ is more preferably low-temperature polycrystalline silicon. The low-temperature polycrystalline silicon is polycrystalline silicon that is formed at a process temperature of 100 to 600° C. Because the range of the process temperature of 100 to 600° C. is a temperature range where alkali-free glass can be used as a substrate, it becomes possible to produce a large-area solid-state imaging device 1 on a glass substrate. The alkali-free glass is, for example, sheet glass having a thickness of 0.3 to 1.2 mm, and used as so-called glass for substrates. The alkali-free glass contains little alkali, has a low coefficient of expansion and high heat resistance, and has stable characteristics. Moreover, the mobility of a low-temperature polycrystalline silicon-based device is 10 to 600 $cm^2/Vs$, and can be made greater than the mobility (0.3 to 1.0 $cm^2/Vs$) of amorphous silicon. That is, the on-resistance can be lowered.

The pixel P as shown in FIG. 3 is produced, for example, by the following process. First, amorphous silicon is film-formed on the glass substrate 7. As the film forming method, for example, plasma CVD is favorable. Next, the amorphous silicon film is sequentially irradiated with laser beams by excimer laser annealing to make the entire surface of the amorphous silicon film into polycrystalline silicon. Thus, a silicon film 3 is formed. Then, after a $SiO_2$ film to serve as a gate insulating film 14 is formed on a partial region of this polycrystalline silicon layer, a gate electrode is formed thereon. Then, an ion implantation process is carried out for regions to be the source region 12 and the drain region 13. Subsequently, by carrying out patterning of the polycrystalline silicon layer, exposure and etching are repeatedly carried out to form electrodes and contact holes, etc. Moreover, after ions are implanted into the silicon film 3 of a region to be the pixel P so as to become n-type, i-type and p-type amorphous silicon layers (i.e. an i-type semiconductor layer 22 and a p-type semiconductor layer 23) are deposited thereon in order to form a PIN photodiode PD, and subsequently, a passivation film to serve as the insulating layer 5 is formed.

The signal connecting section 20 shown in FIG. 1 holds voltage values according to the amounts of charges output from the respective pixels P of the photodetecting section 10, and sequentially outputs the held voltage values. The scanning shift register 40 controls the respective pixels P so that charges accumulated in the respective pixels P are sequentially output to the signal connecting section 20 row by row.

Figure 4:
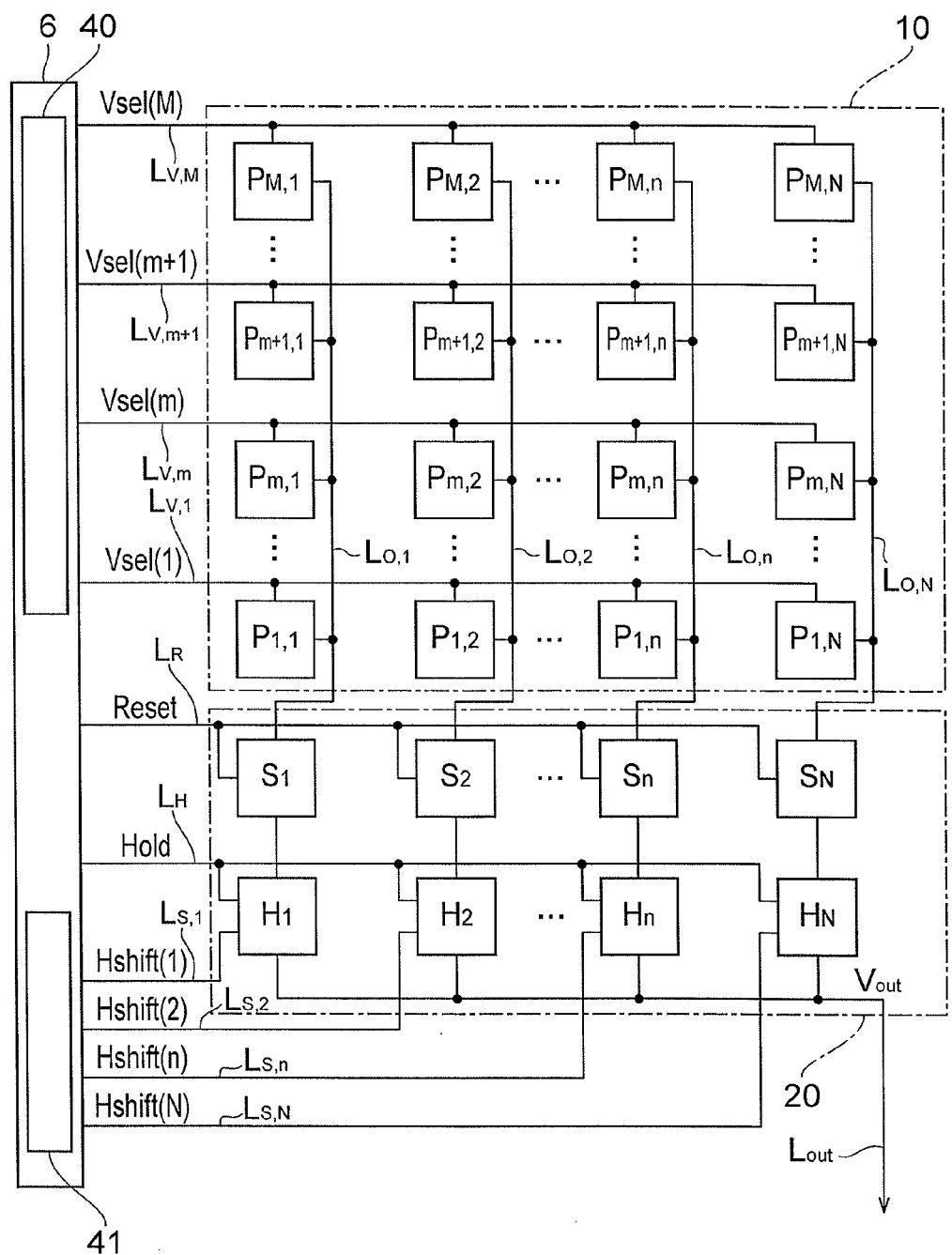
FIG. 4 is a diagram showing an internal configuration of the solid-state imaging device according to the present embodiment.

Next, a detailed configuration of the solid-state imaging device 1 according to the present embodiment will be described. FIG. 4 is a diagram showing an internal configuration of the solid-state imaging device 1. The photodetecting section 10 consists of M×N pixels $P_{1,1}$ to $P_{M,N}$ arrayed two-dimensionally in M rows and N columns. The pixel $P_{m,n}$ is located on the m-th row and the n-th column. Each of the N pixels $P_{m,1}$ to $P_{m,N}$ of the m-th row is connected with the scanning shift register 40 through the m-th row selection wiring line $L_{V,m}$. Also, in FIG. 4, the scanning shift register 40 is included in a controlling section 6. An output end of each of the M pixels $P_{1,n}$ to $P_{M,n}$ of the n-th column is connected, through the n-th column readout wiring line $L_{O,n}$, with the integration circuit $S_n$ of the signal connection section 20.

The signal connecting section 20 includes N integration circuits $S_1$ to $S_N$ and N holding circuits $H_1$ to $H_N$. The respective integration circuits $S_n$ have a common configuration. Moreover, the respective holding circuits $H_n$ have a common configuration. Each integration circuit $S_n$ has an input terminal connected to the n-th column readout wiring line $L_{O,n}$, and accumulates charges input to the input terminal, and outputs a voltage value according to the accumulated charge amount from an output terminal to the holding circuit $H_n$. Each of the N integration circuits $S_1$ to $S_N$ is connected with the controlling section 6 through a reset wiring line $L_R$. Each holding circuit $H_n$ has an input terminal connected to the output terminal of the integration circuit $S_n$, holds a voltage value input to the input terminal, and outputs the held voltage value from an output terminal to a voltage output wiring line $L_{out}$. Each of the N holding circuits $H_1$ to $H_N$ is connected with the controlling section 6 through a hold wiring line $L_H$. Moreover, each holding circuit $H_n$ is connected with a readout shift register 41 of the controlling section 6 through a n-th column selection wiring line $L_{S,n}$.

The scanning shift register 40 of the controlling section 6 outputs an m-th row selection control signal Vsel(m) to the m-th row selection wiring line $L_{V,m}$ to provide this m-th row selection control signal Vsel(m) to each of the N pixels $P_{m,1}$ to $P_{m,N}$ of the m-th row. M row selection control signals Vsel(1) to Vsel(M) sequentially take significant values. Moreover, the readout shift register 41 of the controlling section 6 outputs an n-th column selection control signal Hshift(n) to the n-th column selection wiring line $L_{S,n}$ to provide this n-th column selection control signal Hshift(n) to the holding circuit $H_n$. N column selection control signals Hshift(1) to Hshift(N) also sequentially take significant values.

Moreover, the controlling section 6 outputs a reset control signal Reset to the reset wiring line $L_R$ to provide this reset control signal Reset to each of the N integration circuits $S_1$ to $S_N$. The controlling section 6 outputs a hold control signal Hold to the hold wiring line $L_H$ to provide this hold control signal Hold to each of the N holding circuits $H_1$ to $H_N$.

Figure 5:
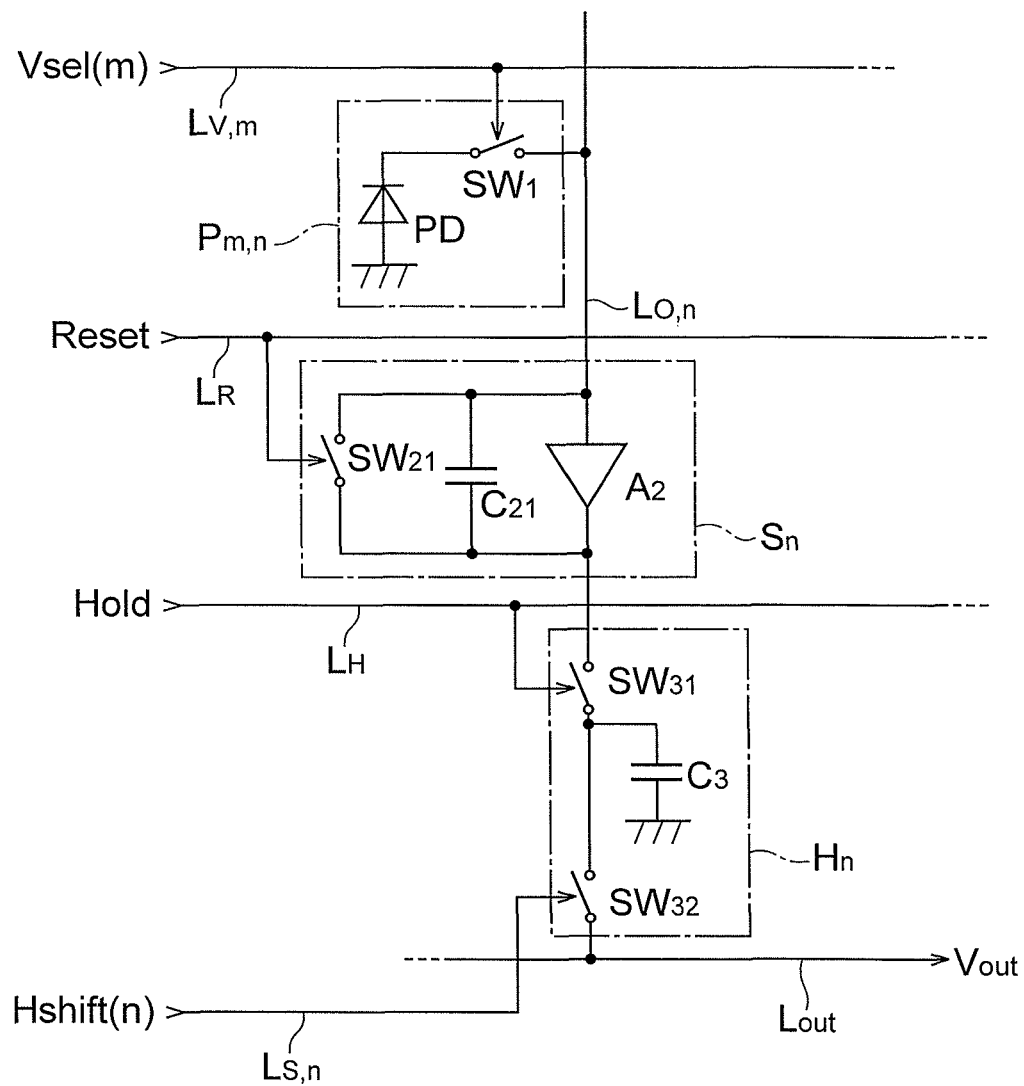
FIG. 5 is a circuit diagram of each of the pixel P, integration circuit S, and holding circuit H of the solid-state imaging device according to the present embodiment.

FIG. 5 is a circuit diagram of each of the pixel $P_{m,n}$, the integration circuit $S_n$, and the holding circuit $H_n$ of the solid-state imaging device 1. Here, a circuit diagram of the pixel $P_{m,n}$ is shown as a representative of the M×N pixels $P_{1,1}$ to $P_{M,N}$, a circuit diagram of the integration circuit $S_n$ is shown as a representative of the N integration circuits $S_1$ to $S_N$, and a circuit diagram of the holding circuit $H_n$ is shown as a representative of the N holding circuits $H_1$ to $H_N$. That is, a circuit portion relating to the pixel $P_{m,n}$ on the m-th row and the n-th column and the n-th column readout wiring line $L_{O,n}$ is shown.

The pixel $P_{m,n}$ includes a photodiode PD and a readout switch $SW_1$. The anode terminal of the photodiode PD is grounded, and the cathode terminal of the photodiode PD is connected with the n-th column readout wiring line $L_{O,n}$ via the readout switch $SW_1$. The photodiode PD generates charge of an amount according to an incident light intensity, and accumulates the generated charge in a junction capacitance section. The readout switch $SW_1$ is provided with an m-th row selection control signal Vsel(m) passed through the m-th row selection wiring line $L_{V,m}$ from the controlling section 6. The m-th row selection control signal Vsel(m) is a signal that instructs an opening and closing operation of the readout switch $SW_1$ in each of the N pixels $P_{m,1}$ to $P_{m,N}$ of the m-th row in the photodetecting section 10.

In this pixel $P_{m,n}$, when the m-th row selection control signal Vsel(m) is low level, the readout switch $SW_1$ opens, and a charge generated in the photodiode PD is not output to the n-th column readout wiring line $L_{O,n}$, but is accumulated in the junction capacitance section. On the other hand, when the m-th row selection control signal Vsel(m) is high level, the readout switch $SW_1$ closes, and the charge generated in the photodiode PD and accumulated in the junction capacitance section until then is output to the n-th column readout wiring line $L_{O,n}$ through the readout switch $SW_1$.

The n-th column readout wiring line $L_{O,n}$ is connected with the readout switch $SW_1$ of each of the M pixels $P_{1,n}$ to $P_{M,n}$ of the n-th column in the photodetecting section 10. The n-th column readout wiring line $L_{O,n}$ reads out a charge generated in the photodiode PD of any of the M pixels $P_{1,n}$ to $P_{M,n}$ via the readout switch $SW_1$ of the pixel, and transfers the charge to the integration circuit $S_n$.

The integration circuit $S_n$ includes an amplifier $A_2$, an integrating capacitive element $C_{21}$ serving as a feedback capacitance section, and a discharge switch $SW_{21}$. The integrating capacitive element $C_{21}$ and the discharge switch $SW_{21}$ are connected in parallel with each other, and provided between an input terminal and an output terminal of the amplifier $A_2$. The input terminal of the amplifier $A_2$ is connected with the n-th column readout wiring line $L_{O,n}$.

The discharge switch $SW_{21}$ is provided with a reset control signal Reset passed through the reset wiring line $L_R$ from the controlling section 6. The reset control signal Reset is a signal that instructs an opening and closing operation of the discharge switch $SW_{21}$ in each of the N integration circuits $S_1$ to $S_N$.

In this integration circuit $S_n$, when the reset control signal Reset is high level, the discharge switch $SW_{21}$ closes, the feedback capacitance section (integrating capacitive element $C_{21}$) is discharged, and a voltage value to be output from the integration circuit $S_n$ is initialized. On the other hand, when the reset control signal Reset is low level, the discharge switch $SW_{21}$ opens, a charge input to the input terminal is accumulated in the feedback capacitance section (integrating capacitive element $C_{21}$), and a voltage value according to the accumulated charge amount is output from the integration circuit $S_n$.

The holding circuit $H_n$ includes an input switch $SW_{31}$, an output switch $SW_{32}$, and a holding capacitive element $C_3$. One end of the holding capacitive element $C_3$ is grounded. The other end of the holding capacitive element $C_3$ is connected to the output terminal of the integration circuit $S_n$ via the input switch $SW_{31}$, and connected with the voltage output wiring line $L_{out}$ via the output switch $SW_{32}$. The input switch $SW_{31}$ is provided with a hold control signal Hold passed through the hold wiring line $L_H$ from the controlling section 6. The hold control signal Hold is a signal that instructs an opening and closing operation of the input switch $SW_{31}$ in each of the N holding circuits $H_1$ to $H_N$. The output switch $SW_{32}$ is provided with an n-th column selection control signal Hshift(n) passed through the n-th column selection wiring line $L_{S,n}$ from the controlling section 6. The n-th column selection control signal Hshift(n) is a signal that instructs an opening and closing operation of the output switch $SW_{32}$ of the holding circuit $H_n$.

In this holding circuit $H_n$, when the hold control signal Hold switches from high level to low level, the input switch $SW_{31}$ switches from a closed state to an open state, and a voltage value being input to the input terminal at this time is held in the holding capacitive element $C_3$. Moreover, when the n-th column selection control signal Hshift(n) is high level, the output switch $SW_{32}$ closes, and the voltage value held in the holding capacitive element $C_3$ is output to the voltage output wiring line $L_{out}$.

The controlling section 6, when outputting a voltage value according to a received light intensity in each of the N pixels $P_{m,1}$ to $P_{m,N}$ of the m-th row in the photodetecting section 10, instructs opening after closing for a predetermined period of the discharge switch $SW_{21}$ in each of the N integration circuits $S_1$ to $S_N$ by a reset control signal Reset, and then instructs opening after closing for a predetermined period of the readout switch $SW_1$ in each of the N pixels $P_{m,1}$ to $P_{m,N}$ of the m-th row in the photodetecting section 10 by an m-th row selection control signal Vsel(m).

After the readout switch $SW_1$ opens, the controlling section 6 instructs switching of the input switch $SW_{31}$ in each of the N holding circuits $H_1$ to $H_N$ from a closed state to an open state by a hold control signal Hold.

Then, the controlling section 6 instructs closing of the discharge switch $SW_{21}$ in each of the N integration circuits $S_1$ to $S_N$ by a reset control signal Reset, and simultaneously therewith instructs closing for a predetermined period of the readout switch $SW_1$ in each of the N pixels $P_{m,1}$ to $P_{m,N}$ of the m-th row in the photodetecting section 10 by an m-th row selection control signal Vsel(m). Further, in parallel with the instruction to close the discharge switch $SW_{21}$ and the instruction to close the readout switch $SW_1$, the controlling section instructs sequential closing of the output switches $SW_{32}$ of the respective N holding circuits $H_1$ to $H_N$ for a given period by column selection control signals Hshift(1) to Hshift(N). The controlling section 6 performs such control as in the above for the respective rows in sequence.

Thus, the controlling section 6 controls an opening and closing operation of a readout switch $SW_1$ in each of the M×N pixels $P_{1,1}$ to $P_{M,N}$ in the photodetecting section 10, and controls a holding operation and an output operation of a voltage value in the signal connecting section 20. Accordingly, the controlling section 6 causes a voltage value according to the amount of charge generated in the photodiode PD of each of the M×N pixels $P_{1,1}$ to $P_{M,N}$ in the photodetecting section 10 to be repeatedly output as frame data from the signal connecting section 20.

Figure 6:
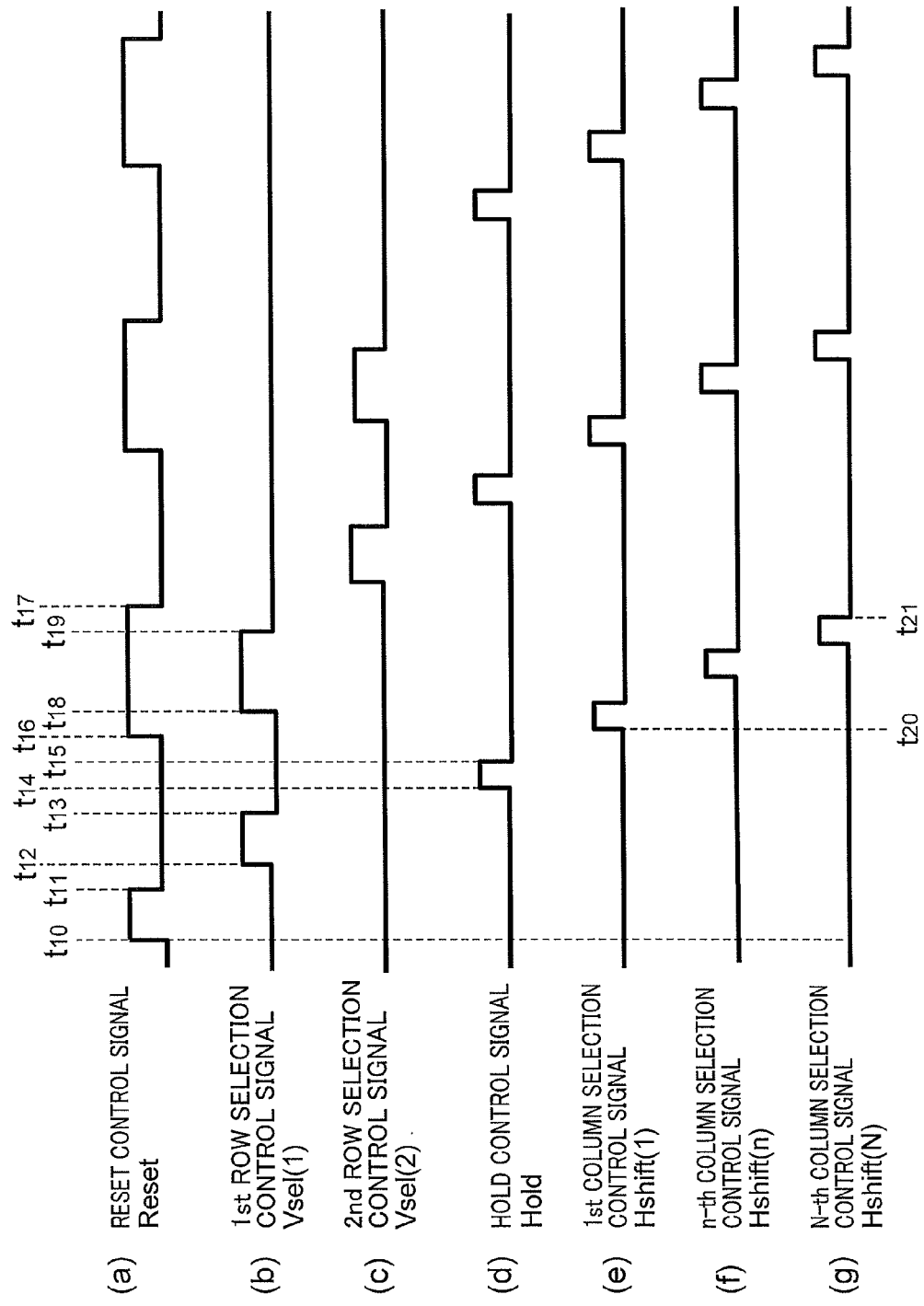
FIG. 6 is a timing chart for explaining operation of the solid-state imaging device according to the present embodiment.

The operation of the solid-state imaging device 1 according to the present embodiment is as follows. FIG. 6 is a timing chart for explaining operation of the solid-state imaging device 1 according to the present embodiment. Also, in the following, a method of driving a solid-state imaging device by the present embodiment will be described along with the operation of the solid-state imaging device 1.

FIG. 6 shows, in order from the top, (a) the reset control signal Reset for instructing an opening and closing operation of the discharge switch $SW_{21}$ in each of the N integration circuits $S_1$ to $S_N$, (b) and (c) the first row selection control signal Vsel(1) and the second row selection control signal Vsel(2) for instructing an opening and closing operation of the readout switch $SW_1$ in each of the pixels $P_{1,1}$ to $P_{1,N}$, $P_{2,1}$ to $P_{2,N}$ of the first row and the second row in the photodetecting section 10, and (d) the hold control signal Hold for instructing an opening and closing operation of the input switch $SW_{31}$ in each of the N holding circuits $H_1$ to $H_N$.

Moreover, FIG. 6 further goes on to show, in order, (e) the first column selection control signal Hshift(1) for instructing an opening and closing operation of the output switch $SW_{32}$ in the holding circuit $H_1$, (f) the n-th column selection control signal Hshift(n) for instructing an opening and closing operation of the output switch $SW_{32}$ in the holding circuit $H_n$, and (g) the N-th column selection control signal Hshift(N) for instructing an opening and closing operation of the output switch $SW_{32}$ in the holding circuit $H_N$.

Charges generated in the photodiodes PD of the pixels $P_{1,1}$ to $P_{1,N}$ of the first row and accumulated in the junction capacitance sections are read out as follows. Before the time $t_{10}$, each of the M row selection control signals Vsel(1) to Vsel(M), the N column selection control signals Hshift(1) to Hshift(N), the reset control signal Reset, and the hold control signal Hold is at low level.

During a period from the time $t_{10}$ to the time $t_{11}$, the reset control signal Reset to be output from the controlling section 6 to the reset wiring line $L_R$ becomes high level, and accordingly, in each of the N integration circuits $S_1$ to $S_N$, the discharge switch $SW_{21}$ reaches a connected state, and the integrating capacitive element $C_{21}$ is discharged.

<First Operation (First Step)>

During a period from the time $t_{12}$ to the time $t_{13}$ after the time $t_{11}$, the first row selection control signal Vsel(1) to be output from the controlling section 6 to the first row selection wiring line $L_{V,1}$ becomes high level, and accordingly, the readout switch $SW_1$ in each of the N pixels $P_{1,1}$ to $P_{1,N}$ of the first row in the photodetecting section 10 reaches a connected state. Charges generated in the photodiodes PD of the respective N pixels $P_{1,1}$ to $P_{1,N}$ and accumulated in the junction capacitance sections are output to the integration circuits $S_1$ to $S_N$ through the readout switches $SW_1$ and the n-th column readout wiring lines $L_{O,1}$ to $L_{O,N}$, and accumulated in the integrating capacitive elements $C_{21}$. From the integration circuits $S_1$ to $S_N$, voltages of the magnitudes according to the amounts of charges accumulated in the integrating capacitive elements $C_{21}$ are output. Also, after the time $t_{13}$, the readout switch $SW_1$ in each of the N pixels $P_{1,1}$ to $P_{1,N}$ of the first row is brought into a non-connected state.

Then, during a period from the time $t_{14}$ to the time $t_{15}$ after the time $t_{13}$, the hold control signal Hold to be output from the controlling section 6 to the hold wiring line $L_H$ becomes high level, and accordingly, the input switch $SW_{31}$ reaches a connected state in each of the N holding circuits $H_1$ to $H_N$. The magnitudes of voltages output from the integration circuits $S_1$ to $S_N$ are held by the holding circuits $H_1$ to $H_N$.

<Second Operation (Second Step)>

Then, during a period from the time $t_{16}$ to the time $t_{17}$ after the time $t_{15}$, the reset control signal Reset to be output from the controlling section 6 to the reset wiring line $L_R$ becomes high level, and accordingly, in each of the N integration circuits $S_1$ to $S_N$, the discharge switch $SW_{21}$ reaches a connected state, and the integrating capacitive element $C_{21}$ is discharged.

Moreover, in parallel with such a discharge operation of the integrating capacitive element $C_{21}$, during a period from the time $t_{18}$ to the time $t_{19}$ after the time $t_{15}$, the first row selection control signal Vsel(1) to be output from the controlling section 6 to the first row selection wiring line $L_{V,1}$ becomes high level, and accordingly, the readout switch $SW_1$ in each of the N pixels $P_{1,1}$ to $P_{1,N}$ of the first row in the photodetecting section 10 reaches a connected state. Charges that have remained without being output from the photodiodes PD in the period from the time $t_{12}$ to the time $t_{13}$ are at this time output to the integration circuits $S_1$ to $S_N$ through the readout switches $SW_1$ and the n-th column readout wiring lines $L_{O,1}$ to $L_{O,N}$, and discharged together with the charges that have been accumulated in the integrating capacitive elements $C_{21}$. Also, in the timing chart shown in FIG. 6, discharging of the photodiode PD in each of the pixels $P_{1,1}$ to $P_{1,N}$ is started (time $t_{18}$) after starting (time $t_{16}$) discharging of the integrating capacitive element $C_{21}$, but discharging of the integrating capacitive element $C_{21}$ may be started after starting discharging of the photodiode PD in each of the pixels $P_{1,1}$ to $P_{1,N}$. Moreover, for stably performing discharging of charges remaining in the photodiodes PD, as shown in FIG. 6, it is preferable to bring the discharge switch $SW_{21}$ into a non-connected state to end (time $t_{17}$) discharging of the integrating capacitive element $C_{21}$ after bringing the readout switch $SW_1$ into a non-connected state to end (time $t_{19}$) discharging of the photodiode PD in each of the pixels $P_{1,1}$ to $P_{1,N}$.

<Third Operation (Third Step)>

Further, in the present embodiment, the following third operation (third step) is carried out in parallel with the foregoing second operation (second step). That is, during a period from the time $t_{20}$ to the time $t_{21}$ after the time $t_{15}$, the column selection control signals Hshift( ) to Hshift(N) to be output from the controlling section 6 to the column selection wiring lines $L_{S,1}$ to $L_{S,N}$ sequentially become high level for a given period, and accordingly, the output switches $SW_{32}$ of the respective N holding circuits $H_1$ to $H_N$ sequentially reach a connected state for the given period, so that the voltage values held in the holding capacitive elements $C_3$ of the respective holding circuits $H_1$ to $H_N$ are sequentially output to the voltage output wiring line $L_{out}$ through the output switches $SW_{32}$.

In the present embodiment, subsequent to the operation for the first row as in the above, the same operation is performed for the second row to the M-th row, so that frame data indicating an image captured in one time imaging is obtained. Also, when the operation ends with respect to the M-th row, the same operation is again performed in a range from the first row to the M-th row, and frame data indicating a next image is obtained. By thus repeating the same operation with a given period, voltage values $V_{out}$ indicating a two-dimensional intensity distribution of an optical image received by the photodetecting section 10 are output to the voltage output wiring line $L_{out}$, and the frame data is repeatedly obtained.

The solid-state imaging device 1 mentioned above causes a charge of the photodiode PD to be output to the integration circuit $S_n$ by bringing the readout switch $SW_1$ into a connected state, and then brings the readout switch $SW_1$ into a non-connected state before holding an output voltage value from the integration circuit $S_n$ by the holding circuit $H_n$. Accordingly, a transient charge generated when the readout switch $SW_1$ was brought into a connected state can be cancelled by a transient charge having a reverse polarity generated when the readout switch $SW_1$ was brought into a non-connected state. Consequently, the problem due to switching noise can be solved.

Moreover, the device causes discharging of a charge held in the integrating capacitive element $C_{21}$, and brings the readout switch $SW_1$ into a connected state to cause discharging of a charge held in the photodiode PD. Accordingly, it becomes possible to discharge together with discharging of the integrating capacitive element $C_{21}$ a charge that remained when outputting a charge of the photodiode PD to the integration circuit $S_n$ in the photodiode PD. Consequently, the problem due to a delay effect can be solved.

Further, in parallel with the second operation (second step) for carrying out discharging of a charge held in the integrating capacitive elements $C_{21}$ and discharging of a charge remaining in the photodiode PD mentioned above, the device carries out a third operation (third step) for causing voltage values held in the holding circuits $H_n$ to be sequentially output. Accordingly, the solid-state imaging device 1 can be driven at high speed without a reduction in frame rate.

Moreover, by the present embodiment, the problem due to switching noise and the problem due to a delay effect can be solved without adding a new circuit. Moreover, by the present embodiment, a reduction in sensitivity can be suppressed to not more than one thousandth.

Moreover, the readout switch $SW_1$ is preferably a semiconductor switch containing polycrystalline silicon. As compared with amorphous silicon, polycrystalline silicon is low in the density of trapping levels, so that the memory effect when the switch is brought into a non-connected state is less likely to occur. Accordingly, the problem due to a memory effect can be solved.

Moreover, as in the present embodiment, it is preferable to bring the discharge switch $SW_{21}$ into a non-connected state to end discharging of the integrating capacitive element $C_{21}$ after bringing the readout switch $SW_1$ into a non-connected state. This allows stably performing discharging of a charge remaining in the photodiode.

The solid-state imaging device and the method of driving a solid-state imaging device by the present invention are not limited to the embodiment and configuration examples mentioned above, and various other modifications can be made.

The solid-state imaging device of the above-mentioned embodiment includes a light receiving section consisting of M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, a signal connecting section including an integration circuit connected to each of the N readout wiring lines, and for outputting a voltage value according to an amount of charge input through the readout wiring line, a holding circuit connected in series via an input switch with the integration circuit, and for holding a voltage value output from the integration circuit, and an output switch connected to the holding circuit, and for outputting a voltage value held in the holding circuit, and a controlling section for controlling opening and closing operations of the readout switches of the respective pixels and the input switches and controlling opening and closing operations of the output switches to cause voltage values according to amounts of charges generated in the photodiodes of the respective pixels to be sequentially output from the holding circuits, and is arranged such that the readout switch is a semiconductor switch containing polycrystalline silicon, the integration circuit includes an amplifier connected in series between the readout wiring line and the holding circuit and an integrating capacitive element connected in parallel with the amplifier, and the controlling section includes a first operation for causing a charge of the photodiode to be output to the integration circuit by bringing the readout switch into a connected state, and then bringing the readout switch into a non-connected state, and thereafter causing a voltage value to be output to the holding circuit from the integration circuit, a second operation for causing a charge held in the integrating capacitive element to be discharged, and bringing the readout switch into a connected state to cause a charge held in the photodiode to be discharged, and a third operation for causing voltage values held in the holding circuits to be sequentially output, and carries out the second operation and the third operation in parallel after carrying out the first operation.

Also, in the second operation mentioned here, it is preferable to end discharging of the integrating capacitive element after bringing the readout switch into a non-connected state. This allows stably performing discharging of a charge remaining in the photodiode.

Moreover, the method of driving a solid-state imaging device of the above-mentioned embodiment is a method of driving a solid-state imaging device including a light receiving section consisting of M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, an integration circuit including an amplifier connected in series to the readout wiring line and an integrating capacitive element connected in parallel with the amplifier, and for outputting a voltage value according to an amount of charge input through the readout wiring line, and a holding circuit for holding a voltage value output from the integration circuit, and includes a first step of causing a charge of the photodiode to be output to the integration circuit by bringing the readout switch into a connected state, and then bringing the readout switch into a non-connected state, and thereafter causing a voltage value to be output to the holding circuit from the integration circuit, a second step of causing a charge held in the integrating capacitive element to be discharged, and bringing the readout switch into a connected state to cause a charge held in the photodiode to be discharged, and a third step of causing voltage values held in the holding circuits to be sequentially output, and is arranged such that the readout switch is a semiconductor switch containing polycrystalline silicon, and the second step and the third step are performed in parallel after the first step.

Also, in the second step mentioned here, it is preferable to end discharging of the integrating capacitive element after bringing the readout switch into a non-connected state. This allows stably performing discharging of a charge remaining in the photodiode.

INDUSTRIAL APPLICABILITY

The present invention can be applied as a solid-state imaging device and a method of driving a solid-state imaging device capable of solving the problem due to a memory effect, the problem due to a delay effect, and the problem due to switching noise.

REFERENCE SIGNS LIST

1—solid-state imaging device, 6—controlling section, 10—photodetecting section, 20—signal connecting section, PD—photodiode, P—pixel, $SW_1$—readout switch, $SW_{31}$—input switch, $SW_{32}$—output switch, $S_n$—integration circuit, $H_n$—holding circuit, $C_{21}$—integrating capacitive element, $A_2$—amplifier, $L_{O,n}$—n-th column readout wiring line.

The invention claimed is:
1. A solid-state imaging device comprising:
a photodetecting section having M×N (each of M and N is an integer not less than 2) pixels, each including a photodiode, that are arrayed two-dimensionally in M rows and N columns;
N readout wiring lines each arranged for each column, and connected via readout switches with the photodiodes included in the pixels of corresponding columns;
a signal connecting section including a plurality of integration circuits each connected to each of the N readout wiring lines, and for outputting a voltage value according to an amount of charge input through each of the readout wiring lines, a plurality of holding circuits each connected in series via an input switch with the corresponding integration circuit, and for holding a voltage value output from the corresponding integration circuit, and an output switch connected to the holding circuit, and for outputting a voltage value held in the holding circuit; and a controlling section for controlling opening and closing operations of the readout switches of the respective pixels and the input switches and controlling opening and closing operations of the output switches to cause voltage values according to amounts of charges generated in the photodiodes of the respective pixels to be sequentially output from the holding circuits, wherein each readout switch is a semiconductor switch containing polycrystalline silicon, each integration circuit includes an amplifier connected in series between the readout wiring line and the holding circuit and an integrating capacitive element connected in parallel with the amplifier, and the controlling section includes a first operation for causing a charge of each of the photodiodes to be output to the corresponding integration circuit by bringing each corresponding readout switch into a connected state, and then bringing the corresponding readout switch into a non-connected state, and thereafter causing a voltage value to be output to each corresponding holding circuit from the integration circuit, a second operation for causing a charge held in the each corresponding integrating capacitive element to be discharged, and bringing the corresponding readout switch into a connected state to cause a charge held in the corresponding photodiode to be discharged, and a third operation for causing voltage values held in the holding circuits to be sequentially output, and carries out the second operation and the third operation in parallel after carrying out the first operation.

2. The solid-state imaging device according to claim 1, wherein in the second operation, discharging of the corresponding capacitive element is ended after the corresponding readout switch is brought into a non-connected state.

3. A method of driving a solid-state imaging device including a photodetecting section having M×N (each of M and N is an integer not less than 2) pixels, each including a photodiode, that are arrayed two-dimensionally in M rows and N columns, N readout wiring lines, each arranged for each column, and connected via readout switches with the photodiodes included in the pixels of corresponding columns, a plurality of integration circuits each including an amplifier connected in series to the corresponding readout wiring line and an integrating capacitive element connected in parallel with the amplifier, and for outputting a voltage value according to an amount of charge input through the corresponding readout wiring line, and a plurality of holding circuits each for holding a voltage value output from the corresponding integration circuit, comprising:

a first step of causing a charge of each photodiode to be output to the corresponding integration circuit by bringing the corresponding readout switch into a connected state, and then bringing the corresponding readout switch into a non-connected state, and thereafter causing a voltage value to be output to the corresponding holding circuit from the corresponding integration circuit;

a second step of causing a charge held in the corresponding capacitive element to be discharged, and bringing the corresponding readout switch into a connected state to cause a charge held in the corresponding photodiode to be discharged; and a third step of causing voltage values held in the holding circuits to be sequentially output, wherein each readout switch is a semiconductor switch containing polycrystalline silicon, and the second step and the third step are performed in parallel after the first step.

4. The method of driving a solid-state imaging device according to claim 3, wherein in the second step, discharging of the corresponding integrating capacitive element is ended after the corresponding readout switch is brought into a non-connected state.

5. A solid-state imaging device comprising:

a photodetecting section having M×N (each of M and N is an integer not less than 2) pixels, each including a photodiode, that are arrayed two-dimensionally in M rows and N columns;

N readout wiring lines each arranged for each column, and connected via readout switches with the photodiodes included in the pixels of corresponding columns;

a signal connecting section including a plurality of integration circuits each connected to each of the N readout wiring lines, and for outputting a voltage value according to an amount of charge input through each of the readout wiring lines, a plurality of holding circuits each connected in series via an input switch with the corresponding integration circuit, and for holding a voltage value output from the corresponding integration circuit, and an output switch connected to the holding circuit, and for outputting a voltage value held in the holding circuit; and a controlling section for controlling opening and closing operations of the readout switches of the respective pixels and the input switches and controlling opening and closing operations of the output switches to cause voltage values according to amounts of charges generated in the photodiodes of the respective pixels to be sequentially output from the holding circuits, wherein each integration circuit includes an amplifier connected in series between the readout wiring line and the holding circuit and an integrating capacitive element connected in parallel with the amplifier, and the controlling section includes a first operation for causing a charge of each of the photodiodes to be output to the corresponding integration circuit by bringing each corresponding readout switch into a connected state, and then bringing the corresponding readout switch into a non-connected state, and thereafter causing a voltage value to be output to each corresponding holding circuit from the integration circuit, a second operation for causing a charge held in the each corresponding integrating capacitive element to be discharged, and bringing the corresponding readout switch into a connected state to cause a charge held in the corresponding photodiode to be discharged, and a third operation for causing voltage values held in the holding circuits to be sequentially output, and carries out the second operation and the third operation in parallel after carrying out the first operation.

6. A method of driving a solid-state imaging device including a photodetecting section having M×N (each of M and N is an integer not less than 2) pixels, each including a photodiode, that are arrayed two-dimensionally in M rows and N columns, N readout wiring lines, each arranged for each column, and connected via readout switches with the photodiodes included in the pixels of corresponding columns, a plurality of integration circuits each including an amplifier connected in series to the corresponding readout wiring line and an integrating capacitive element connected in parallel with the amplifier, and for outputting a voltage value according to an amount of charge input through the corresponding readout wiring line, and a plurality of holding circuits each for holding a voltage value output from the corresponding integration circuit, comprising:
- a first step of causing a charge of each photodiode to be output to the corresponding integration circuit by bringing the corresponding readout switch into a connected state, and then bringing the corresponding readout switch into a non-connected state, and thereafter causing a voltage value to be output to the corresponding holding circuit from the corresponding integration circuit;
- a second step of causing a charge held in the corresponding capacitive element to be discharged, and bringing the corresponding readout switch into a connected state to cause a charge held in the corresponding photodiode to be discharged; and
- a third step of causing voltage values held in the holding circuits to be sequentially output, wherein
- the second step and the third step are performed in parallel after the first step.

* * * * *